(12) United States Patent
Toguchi et al.

(10) Patent No.: US 7,094,122 B2
(45) Date of Patent: Aug. 22, 2006

(54) LIGHT EMITTING DEVICE AND MANUFACTURING METHOD THEREOF AND DISPLAY USED THIS LIGHT EMITTING DEVICE

(75) Inventors: Satoru Toguchi, Tokyo (JP); Hitoshi Ishikawa, Tokyo (JP); Atsushi Oda, Tokyo (JP)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/928,211

(22) Filed: Aug. 30, 2004

(65) Prior Publication Data

US 2005/0026530 A1 Feb. 3, 2005

Related U.S. Application Data

(62) Division of application No. 10/261,158, filed on Sep. 30, 2002, now Pat. No. 6,900,457.

(30) Foreign Application Priority Data

Oct. 3, 2001 (JP) .............................. 2001/307516

(51) Int. Cl.
*H05B 33/22* (2006.01)
(52) U.S. Cl. .......................................... 445/24; 445/23
(58) Field of Classification Search ................ 313/501, 313/503–506; 445/24, 25, 23; 315/169.3; 345/36
See application file for complete search history.

(56) References Cited

U.S. PATENT DOCUMENTS

| | | | | |
|---|---|---|---|---|
| 3,705,285 A | * | 12/1972 | Cachat | 219/646 |
| 5,473,448 A | * | 12/1995 | Yoshinaga et al. | 349/89 |
| 5,920,079 A | * | 7/1999 | Shimizu et al. | 257/18 |
| 6,011,580 A | * | 1/2000 | Hattori et al. | 348/57 |
| 6,194,119 B1 | | 2/2001 | Wolk et al. | 430/200 |
| 6,204,523 B1 | | 3/2001 | Carey et al. | 257/98 |
| 6,512,250 B1 | | 1/2003 | Koyama et al. | 257/98 |
| 2002/0024051 A1 | * | 2/2002 | Yamazaki et al. | 257/79 |

FOREIGN PATENT DOCUMENTS

| | | |
|---|---|---|
| JP | 62-172691 | 7/1987 |
| JP | 1-220394 | 9/1989 |
| JP | 3-152897 | 6/1991 |
| JP | 5-258859 | 10/1993 |
| JP | 5-258860 | 10/1993 |
| JP | 5-275172 | 10/1993 |

(Continued)

*Primary Examiner*—Ashok Patel
*Assistant Examiner*—Christopher M. Raabe
(74) *Attorney, Agent, or Firm*—H.C. Park & Associates, PLC

(57) ABSTRACT

A light emitting device and a manufacturing method thereof and a display used the light emitting device, in which fine patterning for the light emitting device is realized by a simple process and the light leakage is prevented and the efficiency at extracting light is increased, are provided. The light emitting device provides an organic electroluminescent (EL) device in which electrodes and a luminescent layer are formed, a diffraction grating or a zone plate, and a filter. Light emitted from the luminescent layer transmits through the diffraction grating or the zone plate, which is formed with a designated grating pitch, or is reflected at the diffraction grating or the zone plate. With this, the transmitting or reflecting light is controlled to be in a designated angle region. And when the light is transmitted through the filter, light having different color tone and chromaticity from those of the light emitted from the luminescent layer is extracted.

1 Claim, 4 Drawing Sheets

FOREIGN PATENT DOCUMENTS

| | | |
|---|---|---|
| JP | 7-220871 | 8/1995 |
| JP | 10-162958 | 6/1998 |
| JP | 63-314795 | 12/1998 |
| JP | 11-8070 | 1/1999 |
| JP | 11-121164 | 4/1999 |
| JP | 11-283751 | 10/1999 |
| JP | 2991183 | 10/1999 |
| JP | 11-329742 | 11/1999 |
| JP | 2000-284726 | 10/2000 |

* cited by examiner

LIGHT EMITTING DEVICE AND MANUFACTURING METHOD THEREOF AND DISPLAY USED THIS LIGHT EMITTING DEVICE

CROSS REFERENCE

This application is a divisional application of Applicant's U.S. patent application Ser. No. 10/261,158 filed on Sep. 30, 2002, which is herein specifically incorporated by reference in its entirety.

BACKGROUND OF THE INVENTION

The present invention relates to a light emitting device and a manufacturing method thereof and a display used this light emitting device, in particular, which is an organic electroluminescent (EL) device that emits light having wide range wavelengths from blue to red.

DESCRIPTION OF THE RELATED ART

An organic EL device is a self light emitting device, which makes use of the principle that when an electric field is applied, a fluorescent material emits light in response to the charge recombination of holes injected from an anode and electrons injected from a cathode.

Since a report on a low-voltage-driven organic EL device employing multilayered structure was released by C. W. Tang et al. of Eastman Kodak Co. (C. W. Tang, S. A. VanSlyke, Applied Physics Letters, Vol. 51, page 913 (1987)), extensive researches have been made on organic EL devices, that is, EL devices employing organic materials.

In the above report, an organic EL device employing tris(8-quinolinol)aluminum complex for the light-emitting layer and triphenyldiamine derivative for the hole transporting layer was fabricated on a glass substrate. The multilayer structure has some advantages such as: improved hole injection to the light-emitting layer; increase of production efficiency of excitons which are generated by hole-electron recombination (by blocking the paths of electrons injected from the cathode); and confinement of the excitons generated in the light-emitting layer.

As the structure of the organic EL devices, two-layer types (including a hole transporting (and injection) layer and an electron transporting light-emitting layer) and three-layer types (including a hole transporting (and injection) layer, a light-emitting layer and an electron transporting layer) are well known. In order to increase the recombination efficiency of injected holes and electrons, various improvements in the device structure or fabrication process have been introduced to such multi-layered devices.

Further, organic EL devices involve certain limitations on the probability of the creation of singlet excited states of light-emitting material molecules on carrier recombination since the carrier recombination is dependent on spin statistics, thereby the probability of light emission is necessitated to have an upper limit. The upper limit is known as approximately 25%. FIG. 1 is a sectional view of a conventional organic EL device. In FIG. 1, the conventional organic EL device has a structure in which an anode 2, a luminescent layer 3, and a cathode 4 are layered on a substrate 1. As shown in FIG. 1, in conventional organic EL devices, rays of light whose outgoing angles (getting out of the light-emitting layer) are larger than a critical angle (depending on the refractive index of the light-emitting material) can not get out of the light-emitting layer due to total reflection. Therefore, when the refractive index of the light-emitting material is 1.6, only about 20% of the total light emission is available outside, and the upper limit of energy conversion efficiency becomes as low as approximately 5% taking the singlet excited states creation probability into account (Tetsuo Tsutsui "Present situation and trends in organic electroluminescence", Display (monthly), vol. 1, No. 3, page 11 (September 1995). In organic EL devices, having tight limitations on the light emission probability, low light extraction efficiency (low efficiency in extracting light from the organic EL device to outside) causes fatal deterioration of the (total) luminescent efficiency.

In order to make the light extracting efficiency higher, many methods have been studied at light emitting devices such as a conventional inorganic EL device having a similar structure to the organic EL device. For example, Japanese Patent Application Laid-Open No. SHO 63-314795 discloses a thin film EL device. In this patent application, the efficiency is made to be high by forming or attaching light convergent optics on substrate. And Japanese Patent Application Laid-Open No. HEI 1-220394 discloses a high luminance EL device. In this patent application, the efficiency is made to be high by forming a reflection mirror on the side of the device. These methods are effective for a device having a large luminescent area. However, at a device whose pixel area is small, such as a dot matrix display, it is difficult to form the lenses for light convergence or form the reflection mirror on the side of the device. Further, at the organic EL device, the thickness of the luminescent layer is less than a few μm, therefore, it is difficult to form the reflection mirror at the side of the device by tapering the side at the current fine processing technology. If it is realized, the cost is increased largely.

Japanese Patent Application Laid-Open No. SHO 62-172691 discloses a thin film EL device. In this patent application, a flattened layer, whose refractive index is between a glass substrate and a luminescent layer, is disposed between the glass substrate and the luminescent layer, and this flattened layer is made to be a anti-reflection layer. This method has an effect to improve the light extracting efficiency to the forward, but cannot prevent the total internal reflection. Therefore, while being effective for inorganic EL devices (including materials with large refractive indices), the method can not effectively improve the light extraction efficiency of organic EL devices (including light-emitting materials of relatively low refractive indices).

In case that the organic EL devices are used in a display, the organic EL devices are required to emit multi color. There are following three methods to make the organic EL devices emit the multi color.

At the first method, the organic EL device is formed by using one of different luminescent materials for each color, or by doping one of different fluorescent dye for each color. At the second method, light having necessary luminescent color is obtained by eliminating light of unnecessary color from the luminescent of the organic EL element, in which light of necessary colors are included, by using color filters (color filter method). At the third method, light of a color is extracted through a filter (light conversion layer), which contains a fluorescent dye which absorbs the light emitted from organic EL element and emits light of the color (light conversion method).

At a full color display using for displaying such as a natural picture, pixels of R, G, and B are arrayed. Examples having RGB pixels which are formed by using the first method are disclosed in Japanese Patent Applications Laid-Open No. HEI 5-275172, HEI 5-258859, and HEI 5-258860.

In these applications, it is necessary that each pixel for the RGB is formed separately, therefore, the forming process is very complicated, and it is disadvantageous to its mass production.

At the second or the third method, a color filter applied patterning or the light conversion layer applied patterning is used. Therefore, patterning for the organic EL layer is not necessary; consequently, a full color display is easily realized. An example realized a full color display by using the second method is disclosed in Japanese Patent Application Laid-Open No. HEI 7-220871. In this patent application, color filters are combined with the organic EL device emitting white light. And examples, realized a full color display by using the third method, are disclosed in Japanese Patent Applications Laid-Open No. HEI 3-152897 and HEI 11-121164.

However, several times of the photo lithography process are required for forming the color filters or the light conversion layer and the process becomes quite complex. Further, the surface of them becomes uneven. In case that the organic EL device is disposed at a position close to or very close to the color filters or the light conversion layers even when flattening is applied by forming a flattened layer, a short-circuit of pixels frequently occurs. Further, in order to avoid the influence from chemical compounds outputting from the color filters or the light conversion layer, a protection layer must be inserted. Consequently, the performance of the organic EL device is decreased and the manufacturing cost is increased, that is, there are many problems at its mass production.

In order to solve these problems, there is a method in which the color filters or the light conversion layer is disposed at a position having a distance from the organic EL layer such as at the opposite side of the substrate. However, in this method, light emitted by an organic EL device (corresponding to a pixel area) tends to reach adjacent pixel areas, thereby the light leakage problem (light emission from pixel areas that are not supposed to emit light) occurs. In order to resolve the light leakage problem, Japanese Patent Application Laid-Open No. HEI 11-8070 disclosed a method, in which a black mask and a light diffusing layer were formed between the substrate and the organic EL devices. However, the method further deteriorates the light extraction efficiency, since part of the light emitted by the organic EL devices is absorbed by the black mask.

As described above, the prevention of light leakage and the improvement of light extraction efficiency in light-emitting devices employing organic EL devices are both still insufficient. Therefore, techniques capable of satisfying both of the requirements are being sought for, and the development of such techniques is essential for practical utilization of the organic EL devices.

SUMMARY OF THE INVENTION

It is therefore an object of the present invention to provide a light emitting device and a manufacturing method thereof and a display used the light emitting device, in which fine patterning for the light emitting device is realized by a simple process and light leakage is prevented and the efficiency at extracting light is increased.

According to a first aspect of the present invention for achieving the object mentioned above, there is provided a light emitting device. The light emitting device is composed of an organic electroluminescent (EL) device having one or more organic thin film layers including a luminescent layer between an anode and a cathode, a diffraction grating or a zone plate disposed in the organic EL device or adjacent to the organic EL device, and a filter disposed on the outside of the organic EL device and the diffraction grating or the zone plate. And light emitted from the luminescent layer is transmitted through the filter, and light whose color tone and chromaticity are different from those of the light emitted from the luminescent layer is extracted.

According to a second aspect of the present invention, in the first aspect, in the anode and the cathode of the organic EL device which composes a pixel, one of the electrodes is transparent at the visible light region and light is extracted through this electrode, and the other electrode reflects visible light, and the diffraction grating or the zone plate is formed on the electrode that reflects the visible light.

According to a third aspect of the present invention, in the first aspect, in the anode and the cathode of the organic EL device which composes a pixel, one of the electrodes is transparent at the visible light region and light is extracted through this electrode, and the other electrode reflects visible light, and the diffraction grating or the zone plate is formed on the electrode being transparent.

According to a fourth aspect of the present invention, in the third aspect, the diffraction grating or the zone plate has a light transmitting property.

According to a fifth aspect of the present invention, in the first aspect, the diffraction grating or the zone plate has a two-dimensional cycle.

According to a sixth aspect of the present invention, in the first aspect, on one surface of a substrate having a light transmitting property, the electrodes, the one or more organic thin film layers, and the diffraction grating or the zone plate are formed, and on the other surface of the substrate having the light transmitting property, the filter is disposed.

According to a seventh aspect of the present invention, in the first aspect, on a surface of a substrate, the electrodes, the one or more organic thin film layers, and the diffraction grating or the zone plate are formed, and on the side being the same side of the substrate, where the electrodes, the one or more organic thin film layers, and the diffraction grating or the zone plate are formed, the filter is disposed so that the filter does not directly contact the electrodes, the one or plural organic thin film layers, and the diffraction grating or the zone plate.

According to an eighth aspect of the present invention, in the first aspect, the filter contains a fluorescent material or a phosphorescent material, which absorbs the light emitted from the luminescent layer and emits light whose wavelength is different from that of the light emitted from the luminescent layer.

According to a ninth aspect of the present invention, in the first aspect, on a light emitting surface of the filter, the filter has a light scattering function.

According to a tenth aspect of the present invention, there is provided a display. The display comprises arrayed plural light emitting devices mentioned in the first, second, fifth, seventh, eighth and ninth aspect.

According to an eleventh aspect of the present invention, there is provided a display. The display comprises arrayed plural light emitting devices mentioned in the first, third, fourth, fifth, sixth, eighth and ninth aspect.

According to a twelfth aspect of the present invention, there is provided a manufacturing method of a light emitting device. At the manufacturing method of the light emitting device, an organic EL device and a diffraction grating or a zone plate mentioned in the first, second, fifth and seventh aspect and a filter mentioned first, seventh, eighth and ninth aspect, are formed independently, and are adhered each other.

According to a thirteenth aspect of the present invention, there is provided a manufacturing method of a light emitting device. At the manufacturing method of the light emitting device, an organic EL device and a diffraction grating or a zone plate mentioned first, third, fourth, fifth and sixth aspect and a filter mentioned first, sixth, eighth and ninth aspect, are formed independently, and are adhered each other.

According to a fourteenth aspect of the present invention, there is provided a manufacturing method of a display. At the manufacturing method of the display, a light emitting device is formed by that an organic EL device and a diffraction grating or a zone plate mentioned in the first, second, fifth and seventh aspects and a filter mentioned first, seventh, eighth and ninth aspect, are formed independently, and are adhered each other. And the display is formed by arraying plural light emitting devices.

According to a fifteenth aspect of the present invention, there is provided a manufacturing method of a display. At the manufacturing method of the display, a light emitting device is formed by that an organic EL device and a diffraction grating or a zone plate mentioned first, third, fourth, fifth and sixth aspect, and a filter mentioned first, seventh, eighth and ninth aspect, are formed independently, and are adhered each other. And the display is formed by arraying plural light emitting devices.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
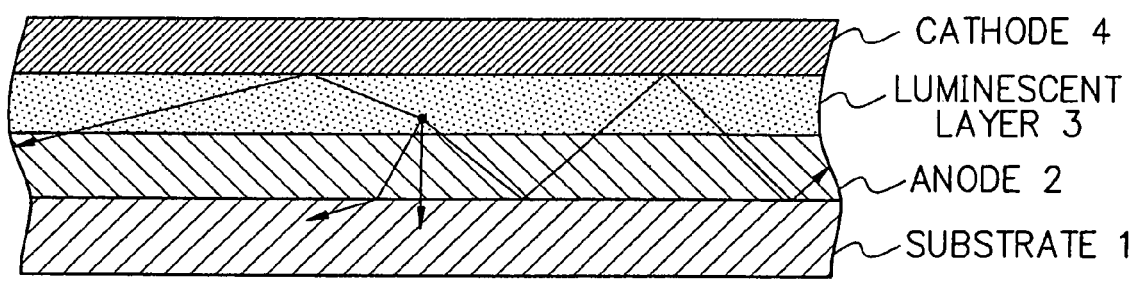
FIG. 1 is a sectional view of a conventional organic EL device.

Referring now to the drawings, embodiments of the present invention are explained in detail. Japanese Patent No. 2991183 discloses an organic EL device. In this patent, it teaches that the light extracting efficiency is increased by combining an organic EL element with a diffraction grating or a zone plate. At the embodiments of the present invention, the emitting angle of light being extracted from an organic EL device is limited within a few degrees, by using a diffraction grating having a suitable grating pitch for light emitted from the organic EL device. With this, the light extracting efficiency is increased.

At the embodiments of the present invention, when a function is almost equal to that at the conventional technology, the same reference number is used.

Figure 2:
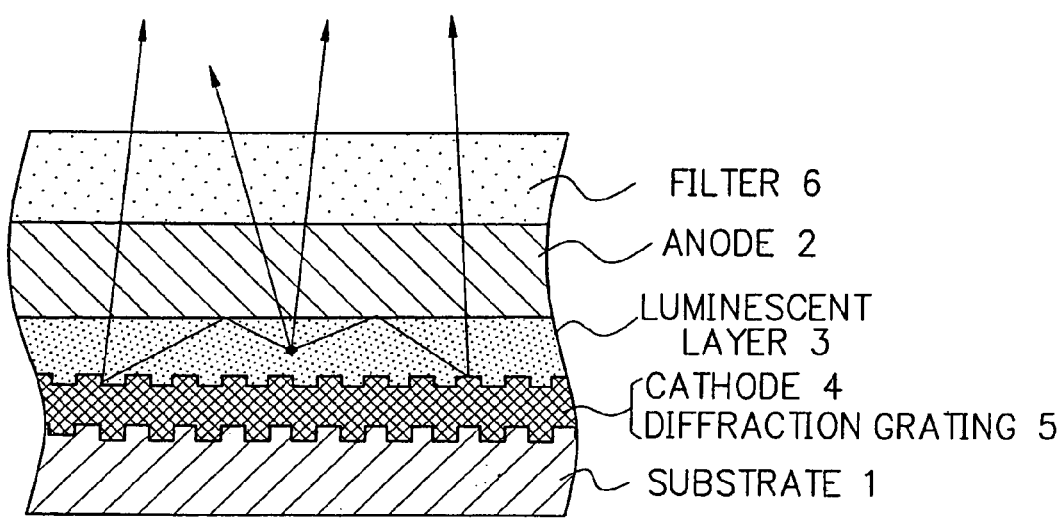
FIG. 2 is a sectional view of a light emitting device using a reflection type diffraction grating at the embodiments of the present invention.

As the diffraction grating at the embodiments of the present invention, both a reflection type and a transmission type can be used. FIG. 2 is a sectional view of a light emitting device using a reflection type diffraction grating at the embodiments of the present invention. As shown in FIG. 2, a diffraction grating 5 of the reflection type is formed on the surface of a substrate 1 and the diffraction grating 5 is also made to work as a cathode 4. A luminescent layer 3 made of an organic luminescent material is formed on the diffraction grating 5 (cathode 4). An anode 2 being transparent is formed on the luminescent layer 3. And a filter 6 is attached on the anode 2.

The diffraction grating 5 of the reflection type can be any shape, if the diffraction grating 5 has its own function. That is, a laminary type grating whose cross section is rectangular or a blade type grating whose cross section has a taper shape is formed on the substrate 1, and the cathode 4 is formed on this grating and is also made to work as a reflection surface. These structures can be used. And also it is possible that the cathode 4 (diffraction grating 5) is formed as a stripe type by using two kinds of cathode materials whose reflection coefficients are different from each other. Or it is also possible that the cathode 4 itself is formed as a stripe pattern and is made to be the diffraction grating 5.

Figure 3:
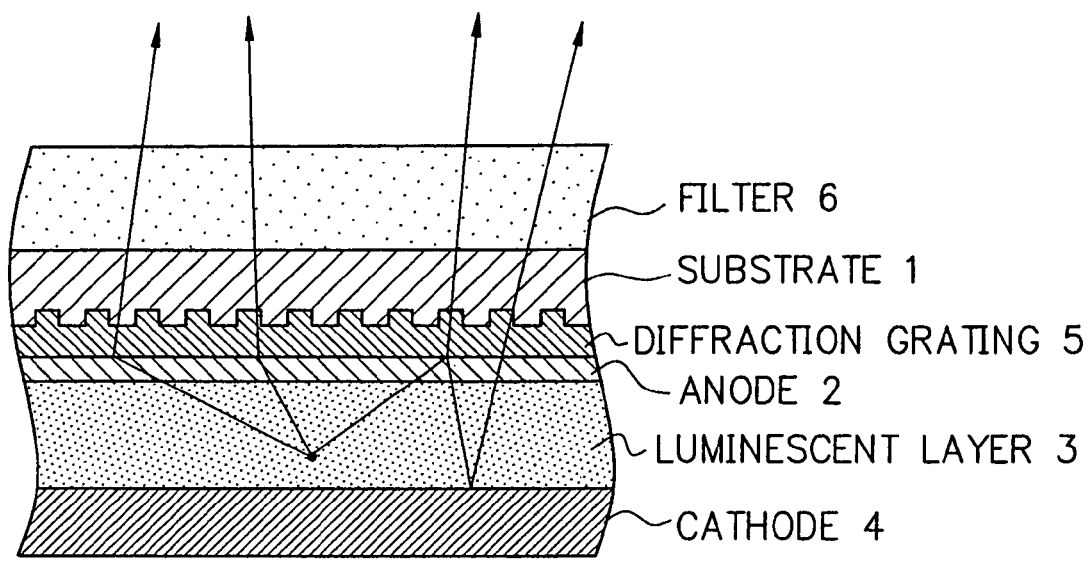
FIG. 3 is a sectional view of a light emitting device using a transmission type diffraction grating at the embodiments of the present invention.

FIG. 3 is a sectional view of a light emitting device using a transmission type diffraction grating at the embodiments of the present invention. As shown in FIG. 3, a diffraction grating 5 of the transmission type is formed on the surface of a substrate 1. After this, an anode 2, a luminescent layer 3 (organic layer), and a cathode 4 are layered on the diffraction grating 5 in this order, and a filter 6 is attached on the substrate 1. With this, the light emitting device is formed.

In this case, as the diffraction grating 5 of the transmission type, both an amplitude type and a phase type can be used, and also the diffraction grating 5 can be any shape. For example, in case that the diffraction grating 5 of the transmission type is the phase type, grooves are formed on the surface of the substrate 1, after this, transparent material layers, whose refractive indexes are different from the substrate 1, are formed on the substrate 1, and the transparent layers are flattened and are made to be the diffraction grating 5. And after the diffraction grating 5 was formed, the anode 2, the luminescent layer 3, and the cathode 4 are layered in this order on the diffraction grating 5.

In case that the diffraction grating 5 of the transmission type is the amplitude type, the diffraction grating 5 can be fabricated by stripe shaped material which does not transmits light on the surface of the substrate 1. Or the anode 2 itself can be formed as a stripe shape, and the anode 2 is also made to work as the diffraction grating 5. In this case, the material of the anode 2 can be transparent or opaque. For example, a gold electrode is used as the anode 2 and this gold electrode is formed in a stripe shape and is also made to work as the diffraction grating 5. After this, the luminescent layer 3 and the cathode 4 are formed on the anode 2, and the light emitting device is formed.

In case that the diffraction grating 5 of the transmission type is used, light inputted to the diffraction grating 5 is divided into transmitting light and being reflected light. However, the reflect angle of the reflected light at the diffraction grating 5 becomes small and the reflected light is reflected at the cathode 4, and is inputted again to the diffraction grating 5 with a small angle. Therefore, the firstly reflected light at the diffraction grating 5 can be finally extracted to the outside as the same as at the reflection type.

The grating pitch size in the diffraction grating 5 is decided so that the light extracting efficiency for a wavelength band of light emitted from the organic EL device is increased and the angle of the extracting light from the light emitting device is within a few degrees. Therefore, it is preferable that the grating pitch size in the diffraction grating 5 is about 0.5 times of the optical length of the wavelength of light which is wanted to be extracted.

Figure 4:
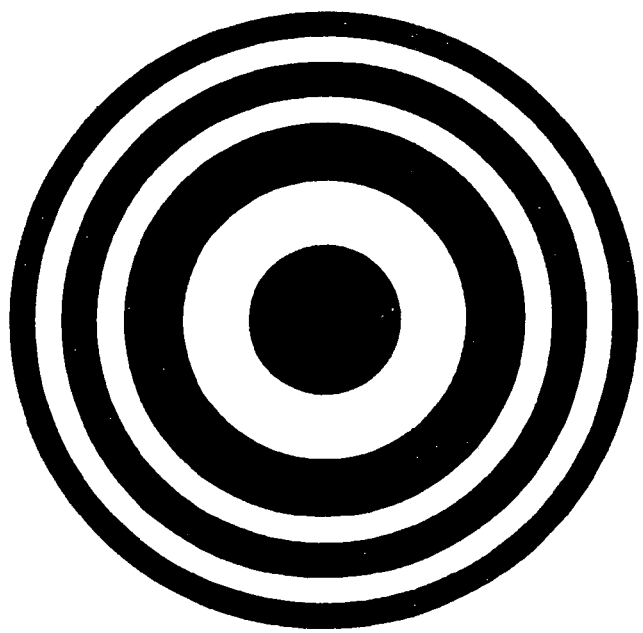
FIG. 4 is a diagram showing an example of a zone plate.

In case of a general diffraction grating, the diffraction effect does not occur in the direction being parallel to the stripe, therefore, the light extracting efficiency in this parallel direction is not increased and the light leakage cannot be restrained. In order to improve this, a two-dimensional diffraction grating can be used. Or a diffraction grating in which the pattern of the grooves has concentric circles can be used. In this case, the interval (pitch) between the concentric circles can be constant. FIG. 4 is a diagram showing an example of a zone plate being one of the diffraction gratings. At the embodiments of the present invention, the zone plate being one of the diffraction gratings can be formed based on the interval (pitch) rule shown in FIG. 4. As the same as the diffraction grating 5 is formed, the zone plate can be formed by forming grooves in the substrate 1, or it is possible that a patterning is applied to one of the electrodes and this electrode applied the patterning is also made to work as the zone plate. When the grooves are formed, the shape of the grooves can be any shape.

By using the diffraction grating 5 or the zone plate, the light from the luminescent layer 3 can be extracted within a few outputting angles. With this structure, in case that the diffraction grating 5 of the transmission type is used, even the filter 6 is disposed at the position where the filter 6 does not directly contact the diffraction grating 5 or the zone plate, the anode 2, the luminescent layer 3 (a thin organic EL layer), and the cathode 4, the light leakage does not occur. In case that the filter 6 is disposed on the substrate 1 being capable of transmitting light, the filter 6 can be adhered on the substrate 1 after forming the light emitting device, therefore, the manufacturing process becomes very simple.

In case that the diffraction grating 5 of the reflection type is used, even the filter 6 is disposed at the side of the anode 2, the luminescent layer 3, and the diffraction grating 5 (the cathode 4) or the zone plate, on the substrate 1, by having a distance from the substrate 1, the light leakage does not occur. In case that the filter 6 is disposed at the side of the anode 2, the luminescent layer 3, and the diffraction grating 5 (the cathode 4) or the zone plate on the substrate 1, the filter 6 can be worked as a sealing cap, therefore, the manufacturing process can be further made to be simple.

Further, a place, between the filter 6 and functions, in which the anode 2, the luminescent layer 3, the diffraction grating 5 or the zone plate are disposed, can be filled with a transmitting material. This material can be gas, liquid, or solid.

The filter 6 has a function that converts light emitted from the luminescent layer 3 to light whose color tone or chromaticity is different from that of the light emitted from the luminescent layer 3, at the time when the emitted light transmits through the filter 6. The filter 6 can be made of color materials themselves, or color materials dissolved or dispersed in a suitable binder. As the color materials for the filter 6, any material, which can absorb light having a desiring wavelength or can emit light having a desiring wavelength, can be used.

As the color materials, pigments, phthalocyanine dyes, such as phthalocyanine blue, phthalocyanine green, an azo dyes, such as disazo yellow, a polycyclic quinone dyes, such as dibromoantoanthrone, a dioxane dyes, such as dioxane violet, can be used. In addition to the pigments mentioned above, as the color materials, dyes, such as stilbene dyes, coumarin dyes, naphthalimide dyes, cyanine dyes, pyridine dyes, rhodamine dyes, oxazine dyes, monoazo dyes, and anthraquinone dyes, can be used.

The examples of stilbene dyes are "1,4-bis (2-methylstyryl) benzene", "trans-4, 4'-diphenylstilbene". The examples of the coumarin dyes are "7-hydroxy-4-methylcoumarin", "2,3,5,6-1H, 4H-tetrahydro-8-trifluoromethylquinorizino (9, 9a, 1-gh) coumarin", "3-(2'-benzothiazolyl)-7-diethylaminocoumarin", and "3-(2'-benzilimidazolyl)-7-N, N-diethylaminocoumarin".

The examples of the naphthalimide dyes are basic yellow 51, solvent yellow 11, and solvent yellow 116. The examples of the rhodamine dyes are "2-(6-(diethylamino)-3-(diethylimino)-3H-xanthene-9-yl) benzenecarboxylic_acid", rhodamine B, and rhodamine 6G. The example of the cyanine dyes is "4-dicyanomethylene-2-methyl-6-(p-dimethylaminostilyl)-4H-pyran. The example of the pyridine dyes is "1-ethyl-2-(4-(p-dimethylaminophenyl)-1, 3-butadienyl)-pyridium-perchlorate".

In addition to the organic color materials mentioned above, as the color materials, inorganic color materials, such as a $Fe_2O_3$ pigment, a $CoO—Al_2O_3—TiO_2—Cr_2O_3$ pigment, and a $CoO—Al_2O_3$ pigment, can be used. And as the color materials, a material, in which one of the coloring matters mentioned above is mixed with a resin and made to be a pigment, can be used. Further, as the color materials, corresponding to the necessity, it is possible that one of these coloring matters and pigments is used as a single material, and also it is possible that a material, in which some of these coloring matters and pigments are mixed, is used.

As the binder, a transparent material is preferable. For example, transparent materials (polymer) such as polymethylmethacrylate, polyacrylate, polycarbonate, polyvinylalcohol, polyvinylpyrrolidone, hydroxyethylcellulose, and carboxymethylcellulose, can be used as the binder. Further, a transparent photosensitive resin, to which a photo lithography method can be applied for the patterning of the filter 6, can be used. Examples of photo curing type resist materials, having a reactive vinyl group, are such as acrylic photoresist, methacrylic photoresist, polyvinylcinnamate, and rubber photoresist. In case that the patterning is executed by using a printing method, printing ink is made of transparent resins such as polyvinyl chloride resin, melamine resin, phenol resin, alkyd resin, epoxy resin, polyurethane resin, polyester resin, maleic acid resin, monomer and oligomer and polymer of polyamide resin, polymethylmethacrylate, polyacrylate, polycarbonate, polyvinylalcohol, polyvinylpyrrolidone, hydroxyethylcellulose, and carboxymethylcellulose. The method forming the filter 6 is not limited to a special method. Conventional methods, such as a vacuum deposition method, a molecular beam epitaxy (MBE) method, a spattering method, a dipping method using a solution, a spin coating method, a casting method, a bar coating method, a roll coating method, and a screen printing method, can be used for forming the filter 6. In case that the filter 6 is also made to work as a sealing material, a gas barrier layer made of such as silicon nitride can be disposed at the filter 6.

The anode of the organic thin-film EL device has the function of injecting holes into the hole transporting layer, therefore, the anode functions efficiently if its work function is 4.5 eV or more. As the materials for the anode 2, materials such as indium-tin-oxide (ITO), tin oxide (NESA), and a metal itself or oxide of gold, silver, platinum, and copper, and a mixed material of them, can be used. The cathode of the organic thin-film EL device has the function of injecting electrons into the electron transporting layer, therefore, it is preferable that the cathode has a small work function. The materials for the cathode 4 is not limited to a special material, however, indium, aluminum, magnesium, magnesium-indium alloy, magnesium-aluminum alloy, aluminum-lithium alloy, aluminum-scandium-lithium alloy, magnesium-silver alloy, and mixed material of them can be used. The method forming the anode 2 and the cathode 4 is not limited to a special method. Conventional methods, such as the vacuum deposition method, the MBE method, the dipping method using a solution, the spin coating method, the casting method, the bar coating method, the roll coating method, and a coating heat cracking method can be used for forming the anode 2 and the cathode 4. In this, in the electrodes of the anode 2 and the cathode 4, one of the electrodes is transparent and the other of the electrodes has a high reflection factor in the visible rays region. The thickness of the electrodes is not limited to a special thickness, if they work well, but actually, it is preferable that the thickness is a value between 0.02 to 2.0 μm.

The structure of the organic EL device of the present invention has a structure in which one or more organic layers are layered between the electrodes mentioned above, and is not limited to a special structure. That is, for example, there are several structures, such as a structure in which an anode, a luminescent layer (organic layer), and a cathode are layered, a structure in which an anode, a hole transporting layer, a luminescent layer, an electron transporting layer, and a cathode are layered, a structure in which an anode, a hole transporting layer, a luminescent layer, and a cathode are layered, and a structure in which an anode, a luminescent layer, an electron transporting layer, and a cathode are layered. In this, the hole transporting layer and the electron transporting layer are organic layers.

At each interface between organic layers or between an organic layer and an electrode, a thin layer composed of inorganic dielectric materials or insulators (lithium fluoride, magnesium fluoride, silicon monoxide, silicon dioxide, silicon nitride, etc.), a mixed layer composed of the mixture of organic material (used in organic layers) and metal (or electrode materials), or a polymeric organic thin layer (polyaniline, polyacetylene derivative, polydiacetylene derivative, polyvinylcarbazole derivative, poly-p-phenylenevinylene derivative, etc.) can be inserted for improving charge injection properties, preventing electrical breakdown or improving luminous efficiency.

The luminescent material using for the present invention is not limited to any material, if the material is usually used as an organic luminescent material. For example, as shown in molecular structures in the following, "tris(8-quinolinol) aluminum complex (Alq3)" [1], "bis(diphenylvinyl)biphenyl(BDPVBi)" [2], "1,3-bis(p-t-butylphenyl-1, 3, 4-oxadiazolyl)phenyl (OXD-7)" [3], "N, N'-bis(2, 5-di-t-butylphenyl)perylenetetracarbolatediimide (BPPC)" [4], and "1, 4-bis(N-p-tolyl-N-p-methylstyrylphenylamino) naphthalene" [5] can be used as the luminescent material.

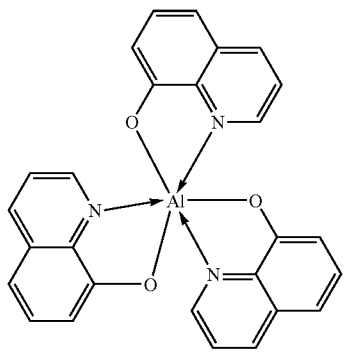

[1]

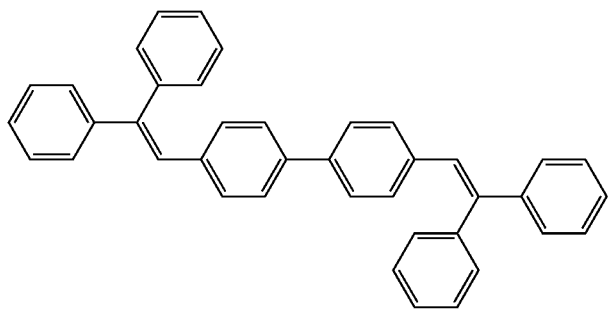

[2]

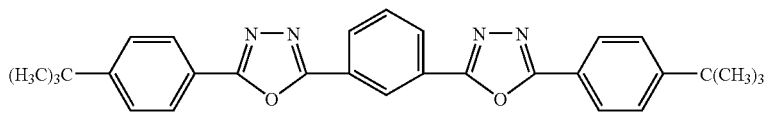

[3]

[4]

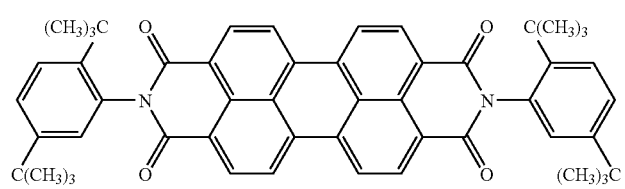

[5]

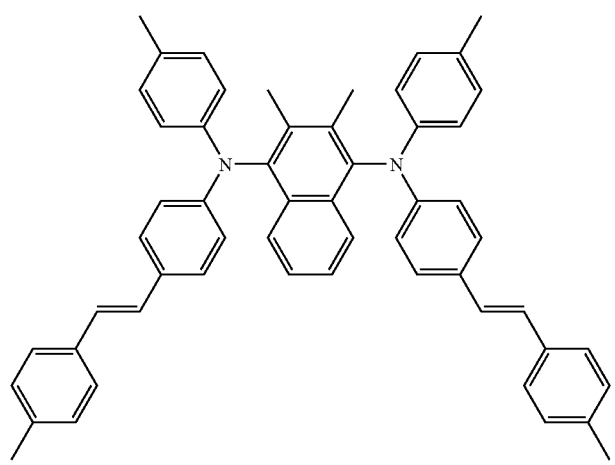

As the light-emitting materials, it is also possible to employ charge transporting materials doped with fluorescent materials. For example, quinolinol-metal complex (such as the aforementioned Alq3 [Formula 1]) doped with 4-dicyanomethylene-2-methyl-6-(p-dimethylaminostyryl)-4H-pyrane (DCM) [Formula 6], quinolinol-metal complex doped with quinacridone derivatives such as 2,3-quinacridone [Formula 7], and quinolinol-metal complex doped with coumarin derivatives such as 3-(2'-benzothiazole)-7-diethylaminocoumarin [Formula 8] can be employed. Examples further include: electron transporting material bis(2-methyl-8-hydroxyquinoline)-4-phenylphenol-aluminum complex [Formula 9] doped with condensed polycyclic aromatic compound such as perylene [Formula 10]; and hole transporting material 4,4'-bis(m-tolylphenylamino)biphenyl (TPD) [Formula 11] doped with rubrene [Formula 12].

[7]

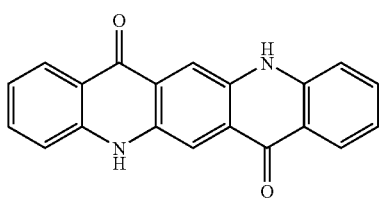

[8]

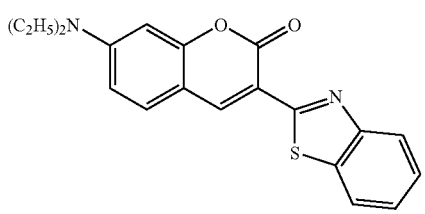

[6]

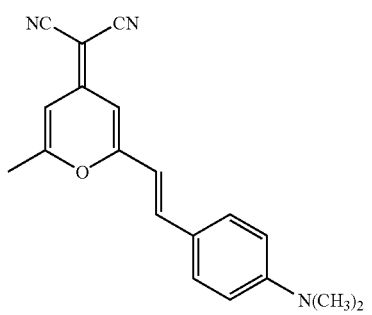

[9]

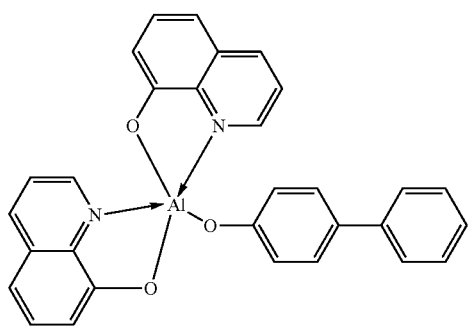

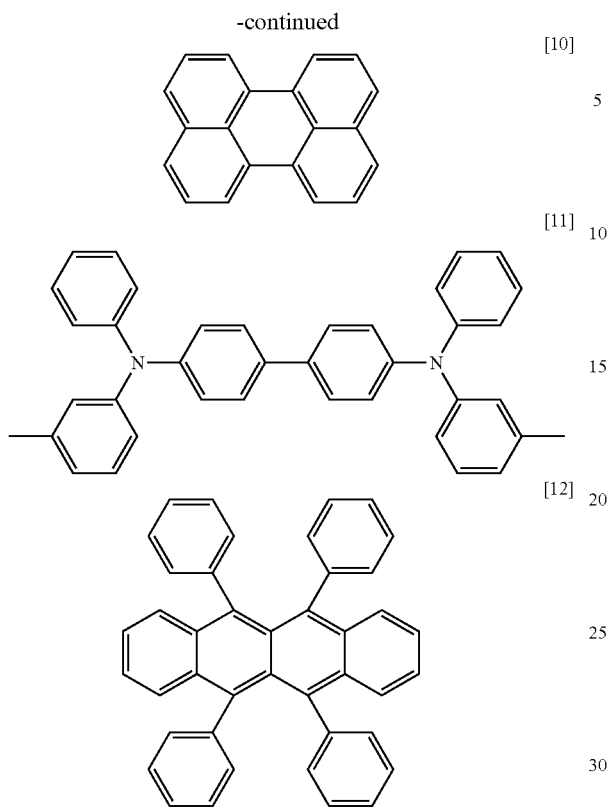

The hole transporting material at the present invention is not limited to any material, if the material is usually used as the hole transporting material. For example, materials shown in the molecular structures in the following and in that mentioned above can be used as the hole transporting material. That is, triphenyldiamines such as "bis(di(p-tolyl) aminophenyl)-1,1-cyclohexane" [13], the TPD [11], "N, N'-diphenyl-N,N'-bis(1-naphthil)-1,1'-biphenyl)-4,4'-di-amine (NPB)" [14], and star burst type amines [15] to [17] can be used as the hole transporting material.

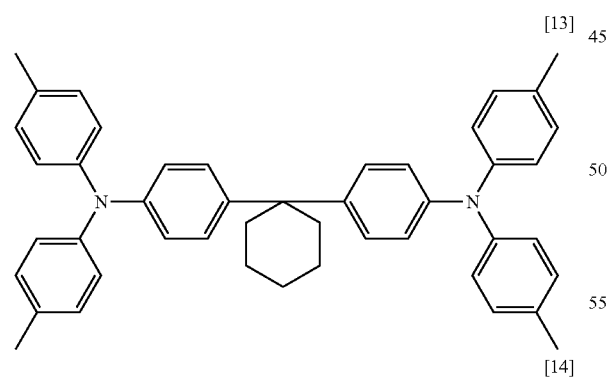

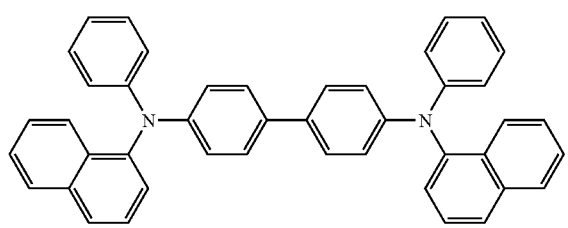

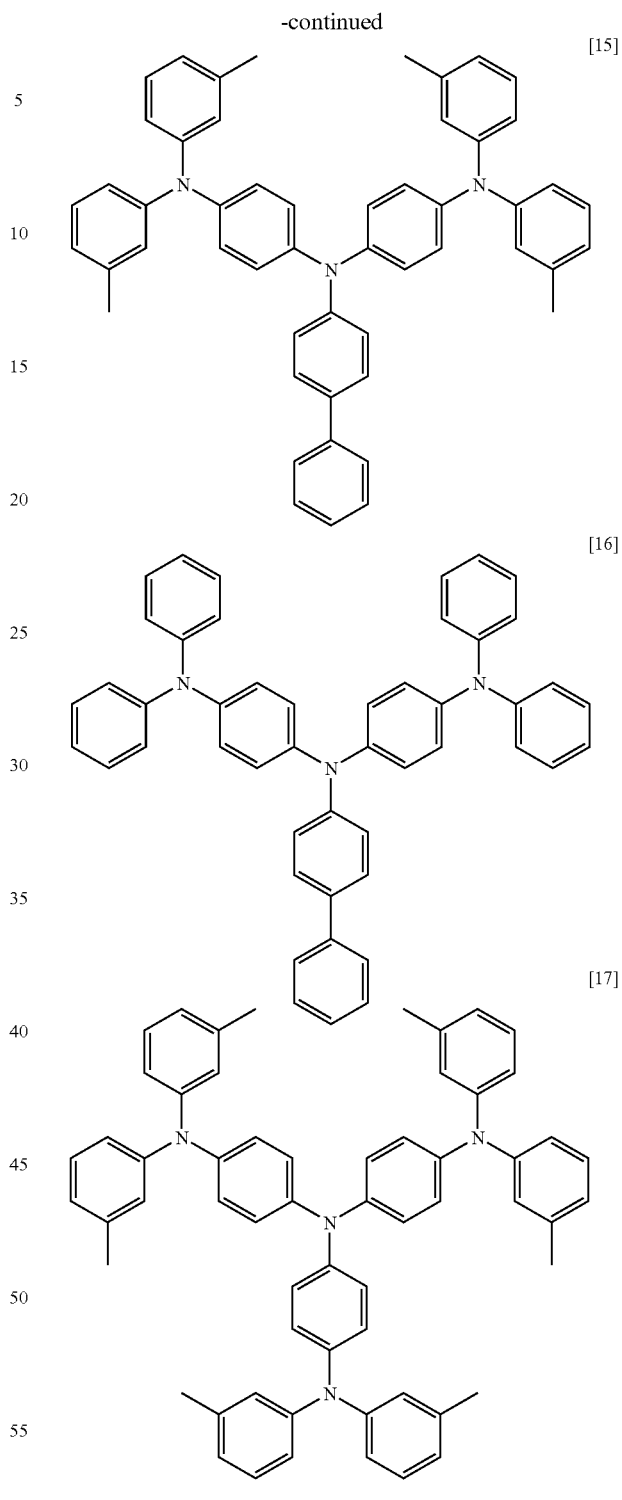

The electron transporting material at the present invention is not limited to any material, if the material is usually used as the electron transporting material. For example, materials shown in the molecular structures in the following and in those mentioned above can be used as the hole transporting material. That is, oxadiazole derivatives such as "2-(4-biphenylyl)-5-(4-t-butylphenyl)-1,3,4-oxadiazole (Bu-PBD)" [18], and the OXD-7 [3], triazole derivatives [19]

and [20], and the quinolinol metal complex [1], [9], and [21] to [24] can be used as the electron transporting material.

[18]
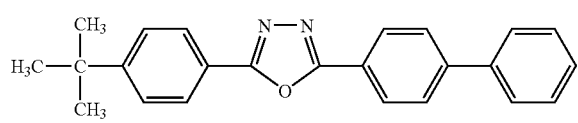

[19]
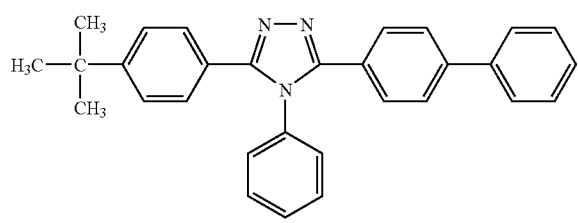

[20]
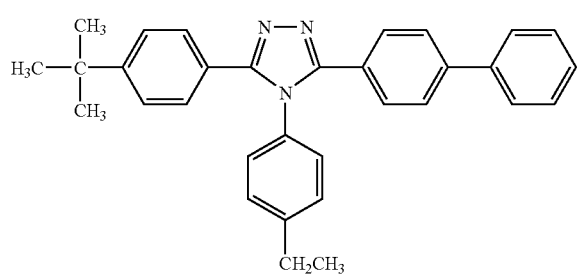

[21]
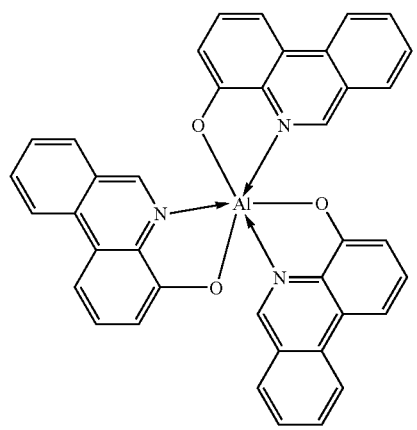

[22]
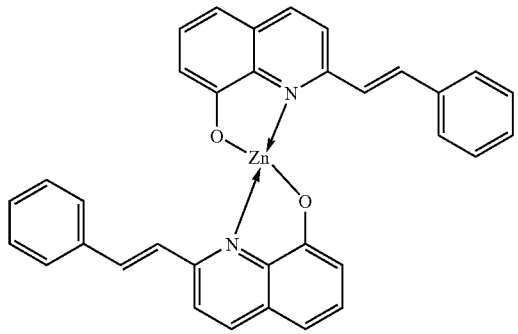

-continued

[23]
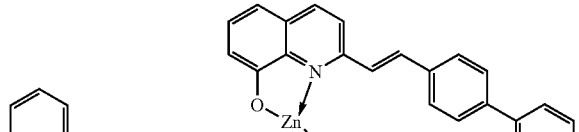

[24]
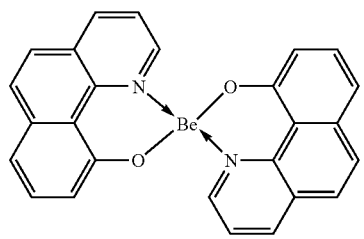

The forming method for each layer of the organic EL device in accordance with the present invention is not limited to any special method. Conventional methods such as the vacuum deposition method and the spin coating method can be used for forming each layer.

However, especially, the organic thin film layers containing chemical compounds are formed by the well known methods such as the vacuum deposition method, the MBE-method, or the dipping method using a solution, or one of the coating methods such as the spin coating method, the casting method, the bar coating method, and the roll coating method.

The thickness of each of the organic thin film layers in the organic EL device of the present invention is not limited to a special thickness, however, generally, it is preferable that the thickness is about a few 10 nm to 1 μm.

Next, a first embodiment of the light emitting device (organic EL device) of the present invention is explained in detail. First, the resist for G line (product of Clariant (Japan) Co., AZTFP650F5) was coated on a 50 mm×25 mm glass substrate (product of HOYA Co., NA45, 1.1 mm thickness) by the spin coating method, and a line and space pattern having 280 nm pitch was formed by a laser interference exposing method. That is, this 280 nm pitch is the pitch of the pattern of the diffraction grating. And grooves were formed on the glass substrate by applying a reactive gas etching. After removal of resist, a high refractive index layer made of titanium oxide having 500 nm thickness was formed on the grooves by the spattering method, and was flattened by an optical polishing. With this, the diffraction grating was formed. On this diffraction grating, an organic EL device, composed of an anode, a hole transporting layer, a luminescent layer, an electron transporting layer, and a cathode, was formed.

On the polished flattened surface, ITO of 100 nm thickness was layered by the spattering method, with this, the anode was formed. At this time, the ITO was formed so that the ITO became a stripe pattern having 200 μm line width and 100 μm gap width by using a metal mask. The sheet resistance of ITO film was 20Ω/□.

The organic thin film layers (hole transporting layer, luminescent layer, and electron transporting layer) were formed by using a vacuum deposition method. For the substrate disposed on a vacuum vessel, a boat made of molybdenum was disposed below 250 mm from the substrate, and the input angle for the substrate was set to be 38 degrees, and the rotation of the substrate was set to be 30 rpm. The vacuum deposition was started when the pressure reached $5 \times 10^{-7}$ Torr, and the vacuum deposition speed was controlled by a crystal resonator type thickness controlling instrument attached to the side of the substrate. The vacuum deposition speed was set to be 0.15 nm/second.

As the hole transporting layer, the thin film of chemical compound [14] having thickness of 40 nm was formed under the conditions mentioned above. The luminescent layer of 70 nm thickness was formed by vacuum deposition of the chemical compound [2], and the electron transporting layer of 40 nm thickness was formed by vacuum deposition of the chemical compound [1], in this order under the same conditions mentioned above.

After this, the cathode of magnesium-silver alloy was formed by depositing magnesium and silver from respective independent boats at the same time. At this time, the depositing speed of magnesium and silver was controlled to be 1.0 nm and 0.2 nm/second, respectively, by the crystal resonator type thickness controlling instrument, and the thickness of the cathode was made to be 200 nm. At this time, the cathode was formed so that the cathode became a stripe pattern having 200 µm line width and 100 µm gap width by using a metal mask, in a state that the stripe pattern of the cathode was disposed to be perpendicular to the stripe pattern of the ITO (anode). On the surface of the glass substrate, being the opposite surface of the surface on which the diffraction grating, the anode, the organic thin film layers, and the cathode were formed, the filter was adhered tightly.

Figure 5:
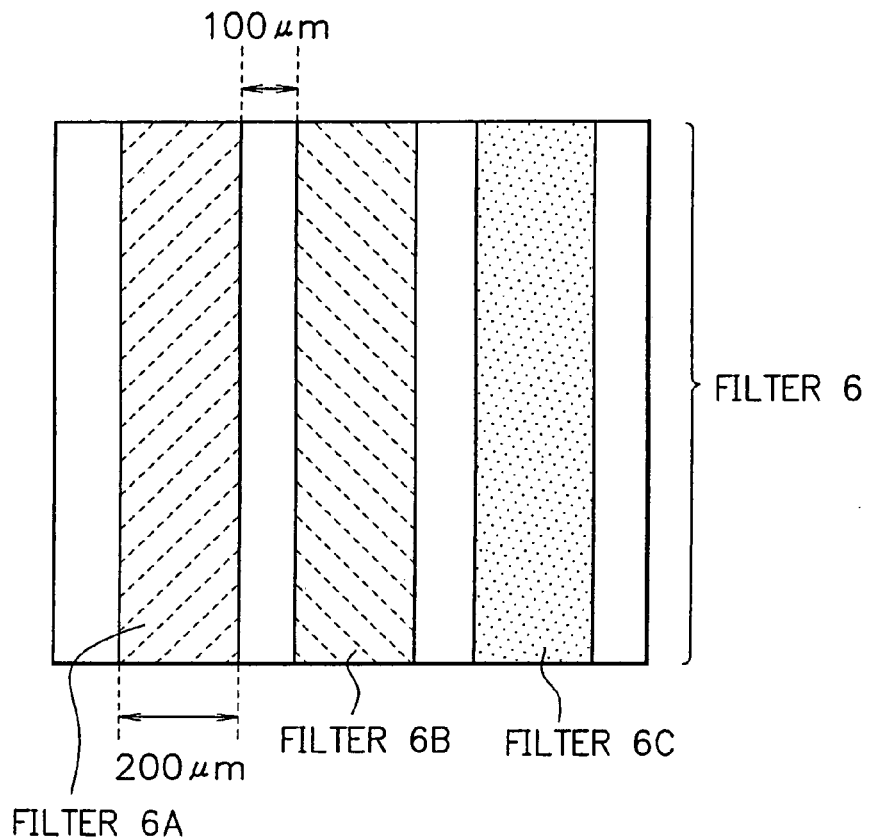
FIG. 5 is a plan view of a filter in the light emitting device of the present invention.

FIG. 5 is a plane view of the filter 6 in the light emitting device of the present invention. In FIG. 5, the filter 6 is shown as an enlarged view. As shown in FIG. 5, the filter 6 was composed of a filter 6A, a filter 6B, and a filter 6C which were embedded in a polyvinylalcohol film and also were arrayed in this order. And the line width of the filters 6A, 6B, and 6C is 200 µm and the gap width between the filters 6A and 6B and between the filters 6B and 6C is 100 µm, that is, the filter 6 was formed as a stripe shape with the lines of 200 µm and the gaps of 100 µm.

Figure 6:
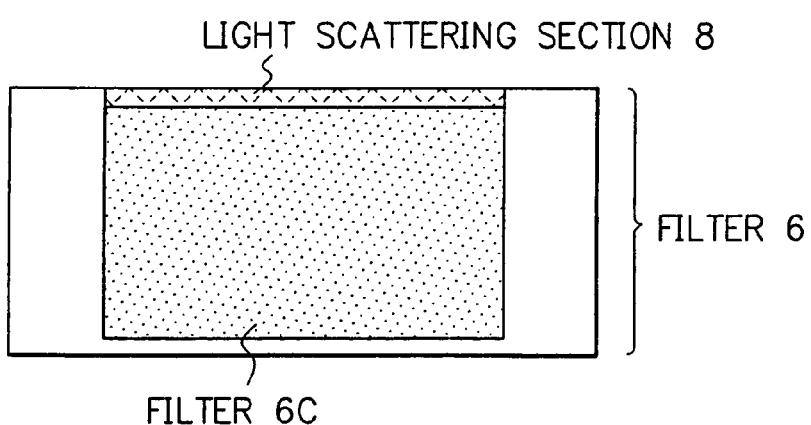
FIG. 6 is a sectional view of a part of the filter shown in FIG. 5.

The filter 6A was made of a mixture of "3-(2'-benzothiazolyl)-7-diethylaminocoumarin" and polyvinyl chloride resin. The filter 6B was made of a mixture of a pigment containing rhodamine and the polyvinyl chloride resin. And the filter 6C was made of a photo-curing type resist material containing copper-phthalocyanine. FIG. 6 is a sectional view of the filter 6C shown in FIG. 5. As shown in FIG. 6, the surface of the filter 6C, being opposite surface of the surface on which the filter 6 is adhered to the substrate was made to be a light scattering section 8 by making the surface rough. And the filter 6 was fixed to a position in which each of the filters 6A, 6B, and 6C met the line of the ITO.

When 8V DC voltage was applied to the light emitting device (organic EL device) of the first embodiment of the present invention, formed by the processes mentioned above, light of green, red-orange, and blue color was emitted from the filter 6A, 6B, and 6C respectively with the luminance of 180, 45, 53 cd/m$^2$ respectively, and the light leakage was not observed.

Next, a second embodiment of the light emitting device (organic EL device) of the present invention is explained. At the second embodiment, the diffraction grating pattern was formed with 275 nm pitch instead of 280 nm pitch at the first embodiment, and the other parts were formed as the same as at the first embodiment. When 8V DC voltage was applied to the light emitting device of the second embodiment of the present invention, light of green, red-orange, and blue color was emitted from the filter 6A, 6B, and 6C respectively with the luminance of 240, 60, 70 cd/m$^2$ respectively, and the light leakage was not observed.

Next, a third embodiment of the light emitting device (organic EL device) of the present invention is explained. At the third embodiment, the diffraction grating pattern was formed with 280 nm on the glass substrate as the same as at the first embodiment. After this, grooves were formed on the glass substrate by applying the reactive gas etching. After removal of resist, on this groove formed surface, a cathode of 200 nm thickness of magnesium-silver alloy was formed by depositing magnesium and silver under the same conditions at the first embodiment. And the cathode is also made to work as the diffraction grating. After this, an electron transporting layer, a luminescent layer, a hole transporting layer, and the ITO (anode) were layered in this order under the same conditions at the first embodiment. The filter 6 used at the first embodiment was adhered on the ITO by placing a spacer at the edge between them so that a space of 0.1 mm was formed between the filter 6 and the ITO. At this time, each of the filters 6A, 6B, and 6C was fixed tightly to meet each of the lines of the ITO. When 8V DC voltage was applied to the light emitting device of the third embodiment of the present invention, light of green, red-orange, and blue color was emitted from the filter 6A, 6B, and 6C respectively with the luminance of 160, 40, 47 cd/m$^2$ respectively, and the light leakage was not observed.

Next, a fourth embodiment of the light emitting device (organic EL device) of the present invention is explained. At the fourth embodiment, the diffraction grating pattern was formed with 275 nm pitch instead of 280 nm pitch at the third embodiment, and the other parts were formed as the same as at the third embodiment. When 8V DC voltage was applied to the light emitting device of the fourth embodiment of the present invention, light of green, red-orange, and blue color was emitted from the filter 6A, 6B, and 6C respectively with the luminance of 220, 55, 67 cd/m$^2$ respectively, and the light leakage was not observed.

Figure 7:
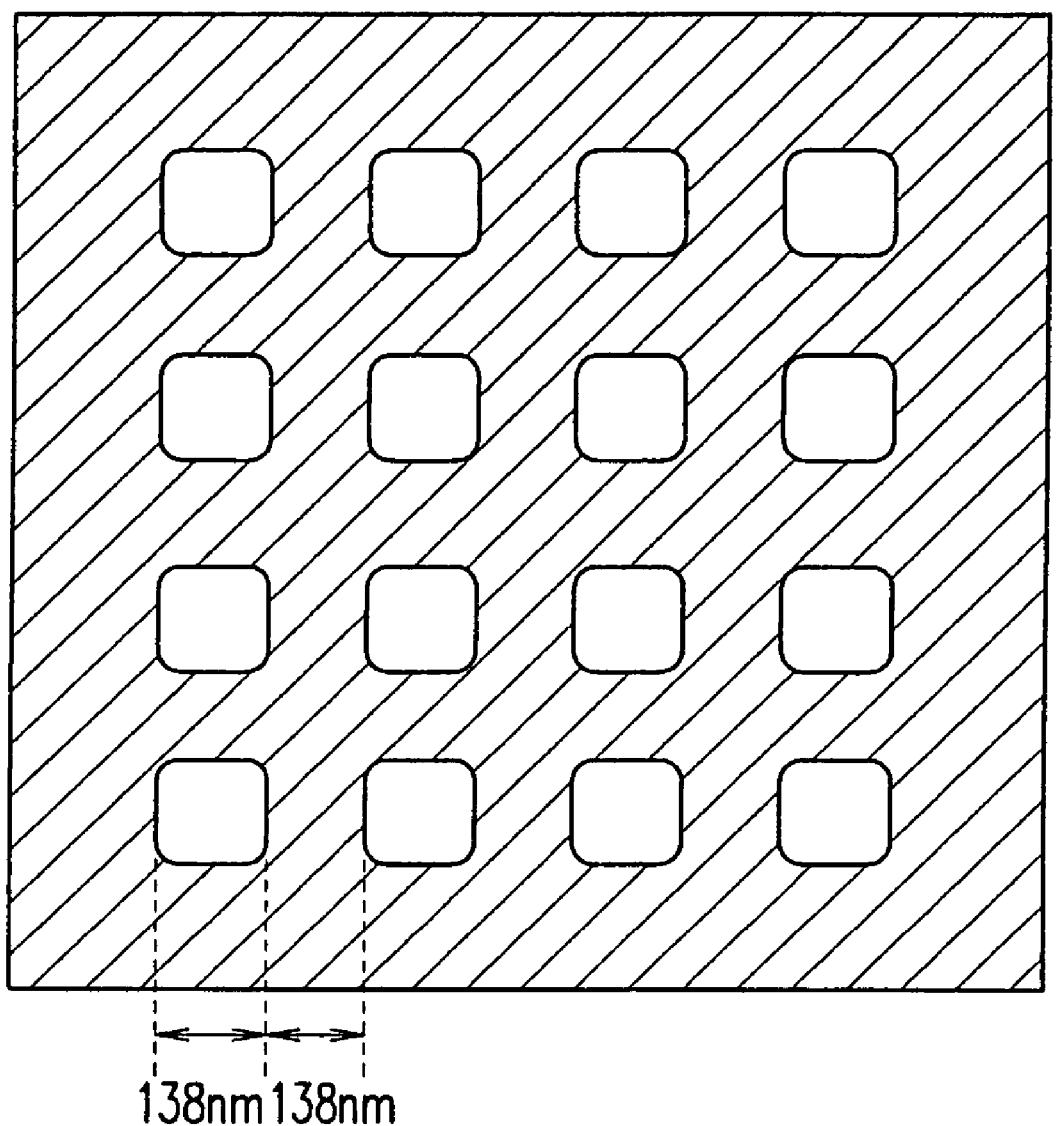
FIG. 7 a plan view of a diffraction grating pattern at the embodiments of the present invention.

Next, a fifth embodiment of the light emitting device (organic EL device) of the present invention is explained. FIG. 7 a plan view of a diffraction grating pattern at the embodiments of the present invention. In FIG. 7, the diffraction grating pattern is shown as a two-dimensional pattern. At the fifth embodiment, the diffraction grating pattern shown in FIG. 7 was used, and the other parts were formed as the same as at the second embodiment. When 8V DC voltage was applied to the light emitting device of the fifth embodiment of the present invention, light of green, red-orange, and blue color was emitted from the filter 6A, 6B, and 6C respectively with the luminance of 280, 70, 80 cd/M$^2$ respectively, and light leakage was not observed.

Next, a sixth embodiment of the light emitting device (organic EL device) of the present invention is explained. At the sixth embodiment, the diffraction grating pattern shown in FIG. 7 was used, and the other parts were formed as the same as at the fourth embodiment. When 8V DC voltage was applied to the light emitting device of the sixth embodiment of the present invention, light of green, red-orange, and blue color was emitted from the filter 6A, 6B, and 6C respectively with the luminance of 300, 75, 90 cd/m$^2$ respectively, and the light leakage was not observed.

As mentioned above, according to a light emitting device and a manufacturing method of the light emitting device and a display used the light emitting device of the present invention, a fine patterning in the light emitting device is realized by a simple process and the light leakage is prevented and the efficiency at extracting light is increased.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A manufacturing method of a light emitting device, comprising:

forming an organic EL device;

forming one of a diffraction grating and a zone plate; and forming a filter, wherein the organic EL device, one of the diffraction grating and the zone plate, and the filter are formed independently and are adhered to each other.

* * * * *